US007026196B2

(12) United States Patent
Hou et al.

(10) Patent No.: US 7,026,196 B2
(45) Date of Patent: Apr. 11, 2006

(54) METHOD OF FORMING FIELD EFFECT TRANSISTOR AND STRUCTURE FORMED THEREBY

(75) Inventors: Chuan-Ping Hou, Yungkong (TW);
Jhi-Cherng Lu, Taipei (TW);
Kuang-Hsin Chen, Jung-li (TW);
Hsun-Chih Tsao, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 22 days.

(21) Appl. No.: 10/720,775

(22) Filed: Nov. 24, 2003

(65) Prior Publication Data
US 2005/0110086 A1 May 26, 2005

(51) Int. Cl.
*H01L 21/84* (2006.01)
(52) U.S. Cl. ..................... 438/151; 438/157; 438/159; 438/163; 438/201; 438/223; 438/241; 257/327; 257/329; 257/331; 257/348
(58) Field of Classification Search ................ 438/151, 438/157, 159, 163, 201, 223, 241, 258, 279, 438/283; 257/327, 329, 331, 347, 348–350
See application file for complete search history.

(56) References Cited

U.S. PATENT DOCUMENTS 6,413,802 B1    7/2002  Hu et al.
6,489,201 B1 *  12/2002 Yoon ........................ 438/257
6,562,665 B1 *  5/2003  Yu ............................ 438/149

OTHER PUBLICATIONS

Fu-Liang Yang et al., "25 nm CMOS Omega FETs", 2002 IEEE, 4 pages.
S. Monfray et al., "50 nm—Gate All Around (GAA)—Silicon On Nothing (SON)—Devices: A Simple Way to Co-integration of GAA Transistors within bulk MOSFET process", 2002 IEEE, 2002 Symposium on VSLI Technology Digest of Technical Papers, 2 pages.
J.P. Colinge et al., "SOI Devices for Sub-0.1 um Gate Lengths", 2002 IEEE, 2002 Proc. 23rd International Conference on Microelectronics (Miel 2002), vol. 1, 2 pages.
Fu-Liang Yang et al., "35 nm CMOS FinFets", 2002 IEEE, 2002 Symposium on VLSI Technology Digest of Technical Papers, 2 pages.

* cited by examiner

*Primary Examiner*—Donghee Kang
(74) *Attorney, Agent, or Firm*—Duane Morris LLP

(57) ABSTRACT

A method for forming a field effect transistor includes: forming a conductive region on an isolation layer formed on a substrate, and a cap dielectric layer on the conductive region; forming a sacrificial dielectric layer over the isolation layer and the cap dielectric layer, and on sidewalls of the conductive region; removing a portion of the sacrificial dielectric layer on the cap dielectric layer; removing the cap dielectric layer; removing remaining portions of the sacrificial dielectric layer; forming a gate on the conductive region; and forming source/drain (S/D) regions within the conductive region and adjacent to the gate. A field effect transistor includes a conductive region over an isolation layer formed on a substrate, the conductive region being substantially without undercut at the region within the isolation layer beneath the conductive region; a gate on the conductive region; and S/D regions within the conductive region and adjacent to the gate.

31 Claims, 6 Drawing Sheets

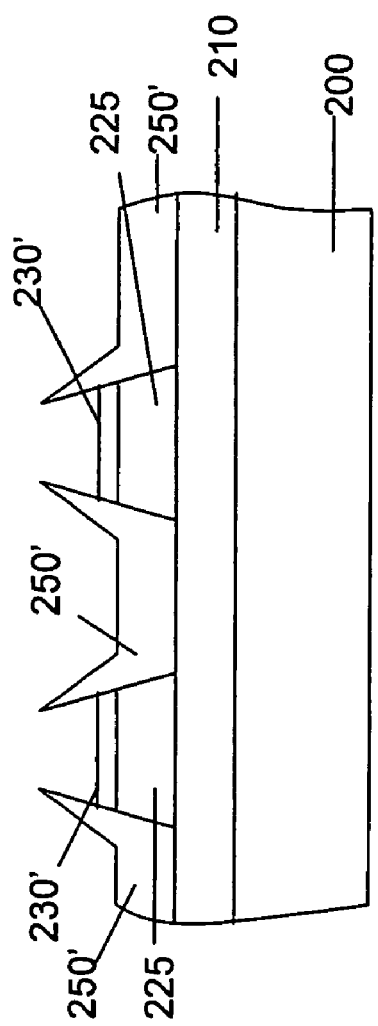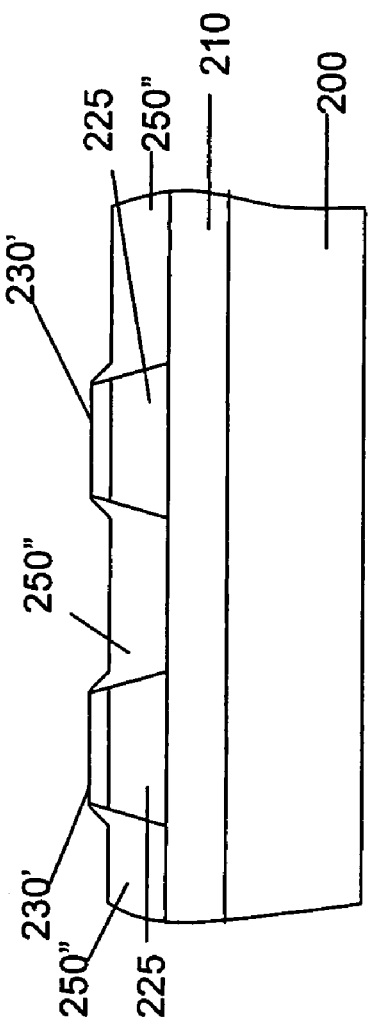

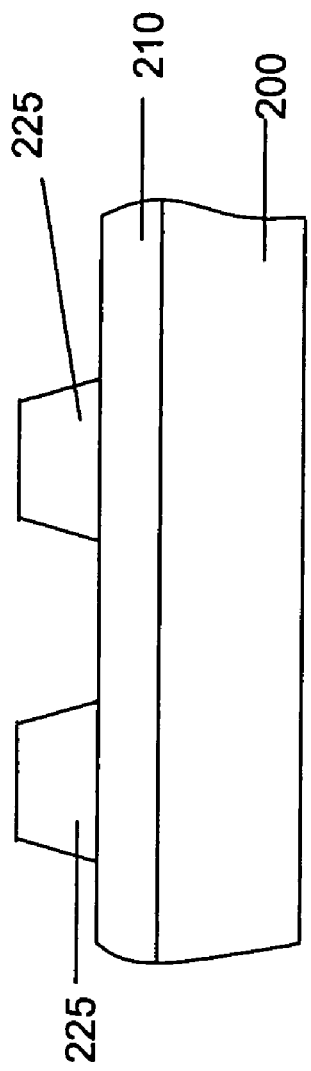
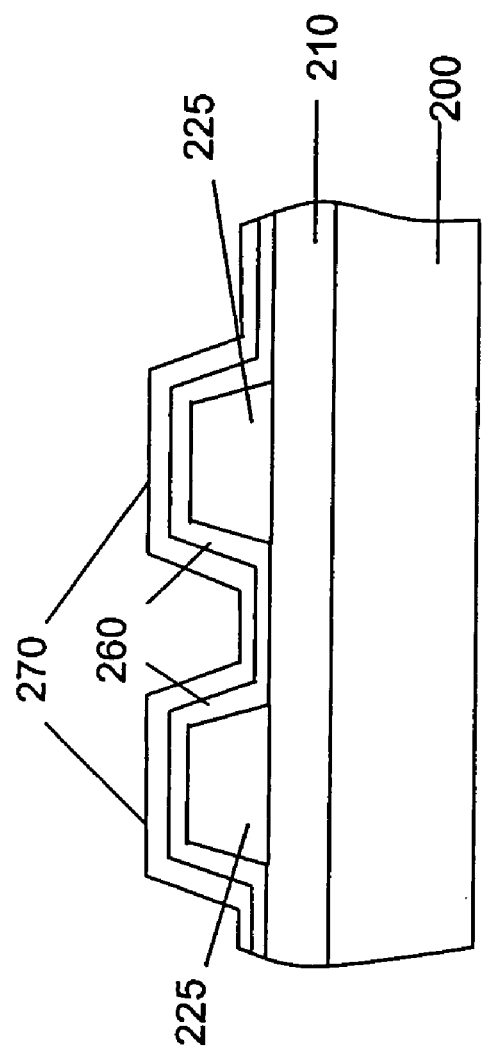

METHOD OF FORMING FIELD EFFECT TRANSISTOR AND STRUCTURE FORMED THEREBY

FIELD OF THE INVENTION

The present invention relates to methods for fabricating semiconductor devices and structures formed thereby; more particularly, the present invention relates to methods for forming a field effect transistor and structures formed thereby.

DESCRIPTION OF THE RELATED ART

In the semiconductor manufacturing industry, high parasitic capacitance and resistance within semiconductor integrated circuits are concerns. New structures and manufacturing methods have been proposed to eliminate the concerns of parasitic capacitance and resistance, for example, a silicon-on-insulator (SOI) substrate and process. Metal-oxide-semiconductor field effect transistors (MOSFETs) formed on a SOI substrate have been demonstrated to be superior to bulk silicon MOSFETs in low power and high-speed applications in very large scale integration (VLSI) because they demonstrate less junction capacitance and better device isolation. In addition, SOI devices also have better immunity to soft errors, reduction in dynamic power, and improvement in latch-up resistance, even with increased packing density. Despite the above outstanding features of SOI devices, SOI integrated circuits have suffered a lack of commercial success due to technical problems in material processing and device design.

FIG. 1 illustrates a cross-sectional view of an active region of a field effect transistor formed on a SOI substrate in accordance with the prior art. The method of forming the structure of FIG. 1 includes forming a silicon layer on a substrate 100 having an oxide isolation layer 110 formed thereon; forming a cap dielectric layer (not shown) on the silicon layer; patterning the cap dielectric layer and the silicon layer to define an active silicon region 120; forming a thermal oxide layer (not shown) only on the sidewalls of the active region 120; and removing the cap dielectric layer. During the cap dielectric layer removal step, a portion of the isolation layer 110 is also removed, and undercut regions 125 are formed beneath the active region 120. Sometimes, a subsequent process for cleaning the substrate prior to forming a gate dielectric layer also contributes to the loss of the isolation layer 110 and further extends the undercut regions 125 beneath the active region 120. This undercut can lead to structure collapse.

A gate dielectric layer (not shown) and a gate layer (not shown) are then formed over the active region 120 and the isolation layer 110. The gate dielectric layer and the gate layer, however, also fill into the undercut regions 125. A patterning process including, for example, photolithographic and etch processes, is then performed to define a gate pattern. Because the gate layer extends into the undercut regions 125, the patterning process does not remove the gate layer formed therein, thereby inducing source/drain regions (not shown) in the transistor that short the transistor and make the transistor fail.

Accordingly, it is desirable to resolve the undercut issue in forming transistors on substrates such as SOI.

SUMMARY OF THE INVENTION

A method for forming active regions of field effect transistors is disclosed, which comprises the steps of: forming a conductive region on an isolation layer formed on a substrate, and a cap dielectric layer on the conductive region; forming a sacrificial dielectric layer over the isolation layer and the cap dielectric layer, and on sidewalls of the conductive region; removing a portion of the sacrificial dielectric layer on the cap dielectric layer; removing the cap dielectric layer; and removing remaining portions of the sacrificial dielectric layer.

A method for forming a field effect transistor is also disclosed, which includes: forming a conductive region on an isolation layer formed on a substrate, and a cap dielectric layer on the conductive region; forming a sacrificial dielectric layer over the isolation layer and the cap dielectric layer, and on sidewalls of the conductive region; removing a portion of the sacrificial dielectric layer on the cap dielectric layer; removing the cap dielectric layer; removing remaining portions of the sacrificial dielectric layer; forming a gate on the conductive region; and forming source/drain (S/D) regions within the conductive region and adjacent to the gate.

A field effect transistor is disclosed, which includes a conductive region on a substrate having an isolation layer formed thereon, the conductive region being substantially without undercut at the region within the isolation layer beneath the conductive region; a gate on the conductive region; and S/D regions within the conductive region and adjacent to the gate.

BRIEF DESCRIPTION OF THE DRAWINGS

The accompanying drawings illustrate preferred embodiments of the invention, as well as other information pertinent to the disclosure, in which:

FIGS. 2A–2H are a series of cross-sectional views illustrating an exemplary embodiment of a method of forming active regions of field effect transistors and a structure of the field effect transistor formed thereby.

DESCRIPTION OF SOME EMBODIMENTS

Figure 1:
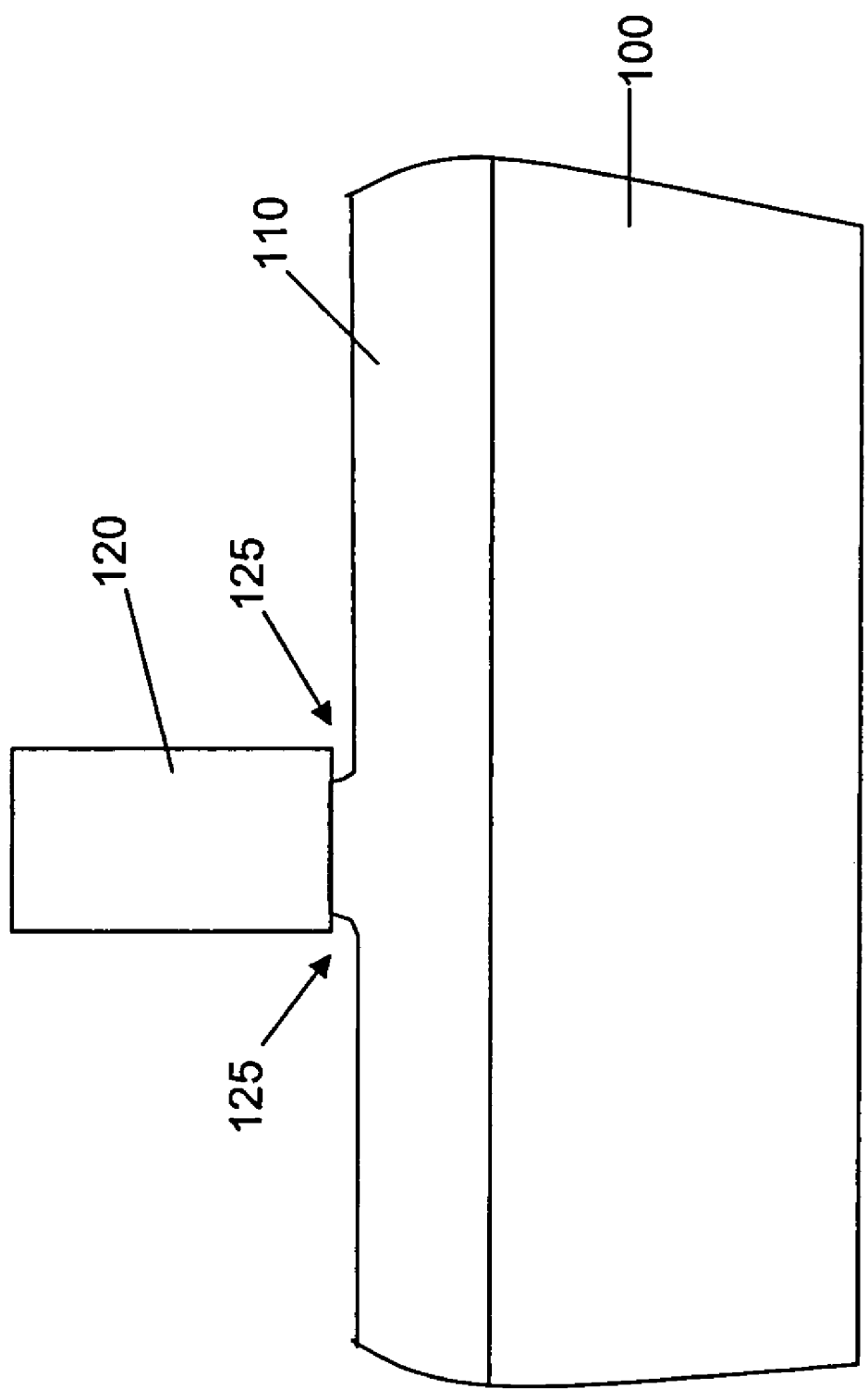
FIG. 1 illustrates a cross-sectional view of an active region of a field effect transistor formed on a silicon-on-insulator (SOI) substrate of the prior art.
Figure 2A:
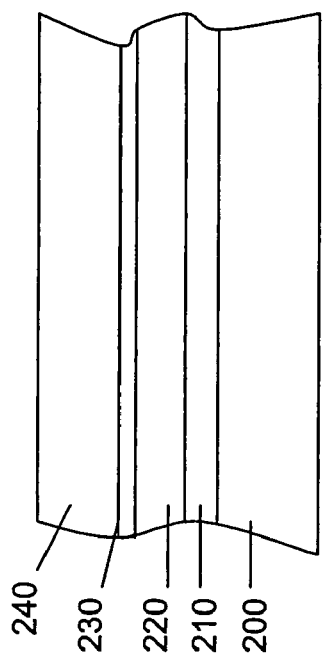

FIGS. 2A–2H are a series of cross-sectional views illustrating an exemplary embodiment of a method of forming active regions of field effect transistors and a structure of a field effect transistor formed thereby. FIG. 2A is a schematic cross-sectional view of an exemplary structure showing a substrate 200 having an isolation layer 210 (also referred to as a "buried oxide" layer), a conductive layer 220, and a first and second cap dielectric layers 230 and 240, respectively, sequentially formed thereon.

The substrate 200 is preferably a substrate adapted to form integrated circuits thereon. The substrate 200 can be, for example, a silicon substrate, silicon-germanium substrate, III–V compound substrate, or any other substrate that can substantially perform the same function of the substrate 200. The isolation layer 210 is selected to isolate the substrate 200 from integrated devices formed thereon. The isolation layer 210 can be, for example, silicon oxide, silicon oxynitride, silicon nitride or any other material that substantially serves the same function of the isolation layer 210, and be formed by, for example, chemical vapor deposition (CVD). In an exemplary embodiment, the isolation layer 210 is silicon oxide. In some embodiments, the isolation layer 210 and the substrate 200 are referred to as a silicon-on-insulator (SOI) substrate. In these embodiments, the isolation layer 210 is referred to as a buried oxide layer.

The conductive layer 220 is selected to serve as an active region layer for forming semiconductor devices. The conductive layer 220 can be, for example, silicon, germanium, silicon-germanium, III–V compound, II–VI compound or any other material that can serve as the conductive layer 220, and is formed, for example, by CVD, metal organic chemical vapor deposition (MOCVD) or molecular beam epitaxy (MBE). In an exemplary embodiment, the conductive layer 220 is silicon.

The first and second cap dielectric layers 230 and 240, respectively, are selected to serve as an etch hard mask layer for defining active regions within the conductive layer 220. The first and second cap dielectric layers 230 and 240, respectively, can be, for example, silicon oxide, silicon nitride, silicon oxynitride or any other material that can serve as the first and second cap dielectric layers 230 and 240, respectively, and be formed by, for example, CVD. In some embodiments, the first and second cap dielectric layers 230 and 240, respectively, are different materials. In an exemplary embodiment, the first cap dielectric layer 230 is silicon oxide, and the second cap dielectric layer 240 is silicon nitride. There is no requirement that two or more cap dielectric layers be formed on the conductive layer 220. In some embodiments, one cap dielectric layer may be sufficient to serve as an etch hard mask layer.

Figure 2B:
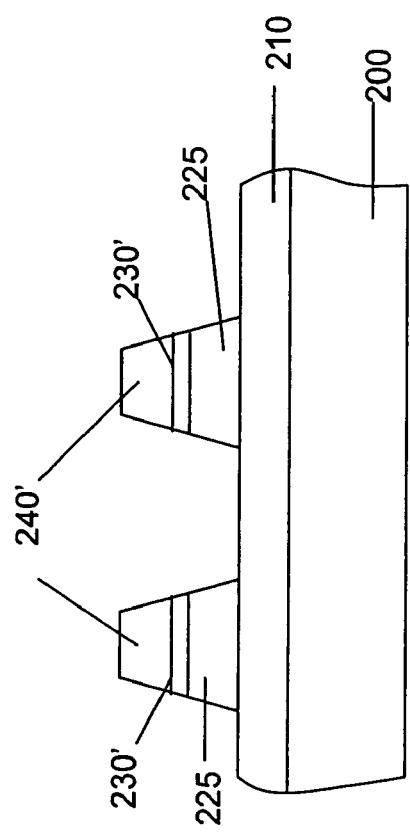

FIG. 2B is a schematic cross-sectional view of an exemplary structure showing conductive regions 225 formed over the isolation layer 210 formed on the substrate 200, and the first and second cap dielectric layers 230' and 240', respectively, sequentially formed on the conductive regions 225. From the structure of FIG. 2A, a patterned photoresist layer (not shown) is formed thereon by a photolithographic process. In some embodiments, a sequential anisotropic etch process is applied to form the conductive regions 225 from the conductive layer 220 and the first and second cap dielectric layers 230' and 240', respectively. In the embodiment show in FIG. 2B, the sequential anisotropic etch process uses, for example, $CF_4$, $CHF_3$, $CH_2F_2$ or $NF_3$ as an etch gas for etching the silicon nitride cap dielectric layer 240; $CF_4$, $CHF_3$, $C_2F_6$, $C_3F_8$, or $C_4F_8$ as an etch gas for etching the silicon oxide layer 230; and chlorine gas ($Cl_2$) or HBr, and chlorine silane ($SiCl_4$) as an etch gas for etching the silicon layer 220.

After the conductive regions 225 and the first and second cap dielectric layers 230' and 240', respectively, are formed, the patterned photoresist layer is removed by a removal process, such as a dry etch process using oxygen as a reaction gas or a wet etch process using $H_2SO_4$ and $H_2O_2$ as a reaction solution. In the embodiment shown in FIG. 2B, the conductive regions 225 have a mesa structure that provides advantages for subsequent processes, such as the improvement of the etch margin for patterning the gate and/or the enhanced filling ability of an interlayer dielectric (ILD) between the active regions 225.

Figure 2C:
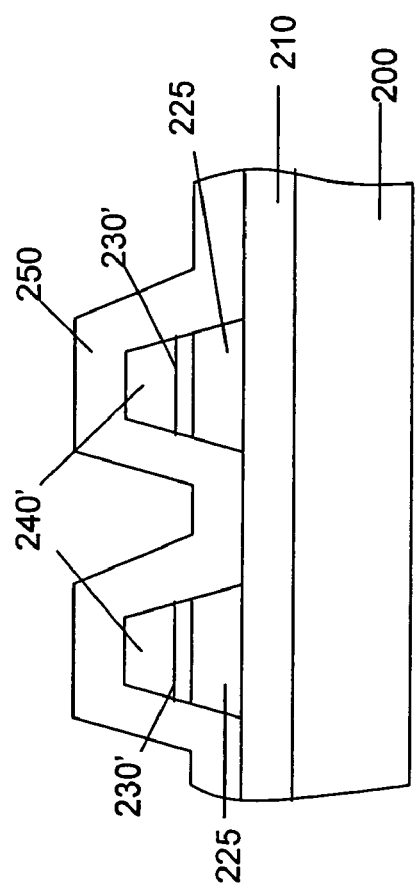

FIG. 2C is a schematic cross-sectional view of an exemplary structure illustrating a sacrificial dielectric layer 250 formed over the structure of FIG. 2B, i.e. over the isolation layer 210 and the second cap dielectric layer 240', and on the sidewalls of the conductive regions 225. The sacrificial dielectric layer 250 can be, for example, silicon oxide, silicon nitride, or silicon oxynitride, and be formed by, for example, CVD or spin-on coating. In an exemplary embodiment, the sacrificial dielectric layer 250 is high density plasma (HDP) oxide formed by HDPCVD. The sacrificial dielectric layer 250 is formed to a thickness at least larger than a thickness loss caused by sequential cleaning or removing processes, such as those used in the removal of the first and second cap dielectric layers 230' and 240', respectively, and a cleaning step implemented prior to forming a gate dielectric layer.

Figure 2D:
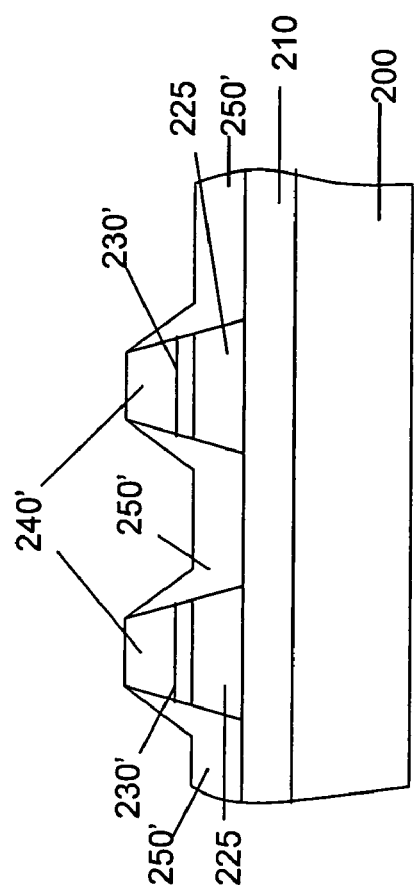

FIG. 2D is a cross-sectional view of an exemplary structure showing that a portion of the sacrificial dielectric layer 250 on the second cap dielectric layer 240' is removed leaving remaining portion 250'. The removal of the portion of the sacrificial dielectric layer 250 on the second cap dielectric layer 240' can be performed, for example, by chemical mechanical polish (CMP) or etch back. In the embodiment shown in FIG. 2D, the removing step is performed by a CMP process with a high selectivity slurry that achieves a high degree of planarity. In this embodiment, the CMP process with the high selectivity slurry, which, in one embodiment, comprises ceria abrasives and electronegative surfactants (additives such as Tri-alkylamine ($N(C_xH_y)_3$) or PAA ($(CH_2CHCOOH)_n$ where n is between about 200–300)) that protect the lower area (e.g., the trench oxide), has different removal rates for different regions of the sacrificial dielectric layer 250 in response to different polish pressures applied thereto. The additives suppress polish rates at the stop layer and/or suppress polish rates at concave areas. By using such a CMP process, the thickness loss of the sacrificial dielectric layer 250' between the conductive regions 225 can be substantially reduced; therefore, the sacrificial dielectric layer 250' remains substantially intact between active regions 225 and serves to protect the isolation layer 210 from damage resulting from subsequent cleaning or removing processes. The remaining sacrificial isolation layer 250' thereby substantially prevents undercut beneath the active regions 225 in subsequent processes.

FIG. 2E is a cross-sectional view of an exemplary structure showing that the remaining portions of the second cap dielectric layer 240' is removed. The removal of the second cap dielectric layer 240' can be performed, for example by a dry etch process or a wet etch process dependent on the material selected for the cap dielectric layer 240. In one embodiment, the second cap dielectric layer 240' is silicon nitride, which is removed by a dry etch process using, for example, $CF_4$, $CHF_3$, $CH_2F_2$ or $NF_3$ as an etch gas, or by a wet etch process using, for example, a hot $H_3PO_4$ solution.

FIG. 2F shows a cross-sectional view of an exemplary structure after a sputtering process is performed to trim the portions of the sacrificial dielectric layer 250' of FIG. 2E extending above the cap dielectric layer 230', leaving remaining sacrificial dielectric portions 250". The sputtering process can be performed by, for example, a plasma sputtering process using a reaction gas, such as Argon. However, there is no requirement that the sputtering process be performed if the topography of the structure of FIG. 2E is sufficiently smooth for subsequent processing.

FIG. 2G is a cross-sectional view of an exemplary structure showing that the first cap dielectric layer 230' and the remaining portions of sacrificial dielectric layer 250" are removed. The methods of removing the first cap dielectric layer 230' and the remaining sacrificial dielectric layer 250" depend on the materials selected for those layers. These layers can be removed by a wet etch process, a dry etch process or a combination thereof. In one embodiment, the first cap dielectric layer 230' and the remaining portions of sacrificial dielectric layer 250" are formed from silicon oxide and are removed by, for example, a HF solution.

In one embodiment, after dielectric layer 230' is removed, oxide layer 250" remains in sufficient thickness to protect isolation layer 210 and conductive regions 225 from undercut during a cleaning process (such as an HF clean) employed prior to gate dielectric deposition (described below). In one embodiment, the protective oxide layer extends above isolation layer 210 about 20% of the thickness of the conductive layer 225 (e.g., if conductive layer 225 is 500 Å thick, protective oxide layer is about 100 Å thick).

FIG. 2H illustrates a cross-sectional view of an exemplary structure after gate dielectric layers 260 and gate electrode layers 270 are sequentially formed on the conductive regions 225. The gate dielectric layers 260 can be, for example, oxide, nitride, oxynitride, or high dielectric constant material, and can be formed, for example, by CVD or PVD. The gate electrode layers 270 are formed from a conductive material, such as polysilicon, WSi, or metal, and can be formed, for example, by a furnace, CVD or PVD process. In some embodiments, a photolithographic process and an etch process are applied to pattern the gate structure formed on the conductive regions 225 to form the gate dielectric and gate electrode of the field effect transistor. In one embodiment, the gate dielectric layers 260 are silicon oxide, and the gate electrode layers 270 are polysilicon.

Figure 2I:
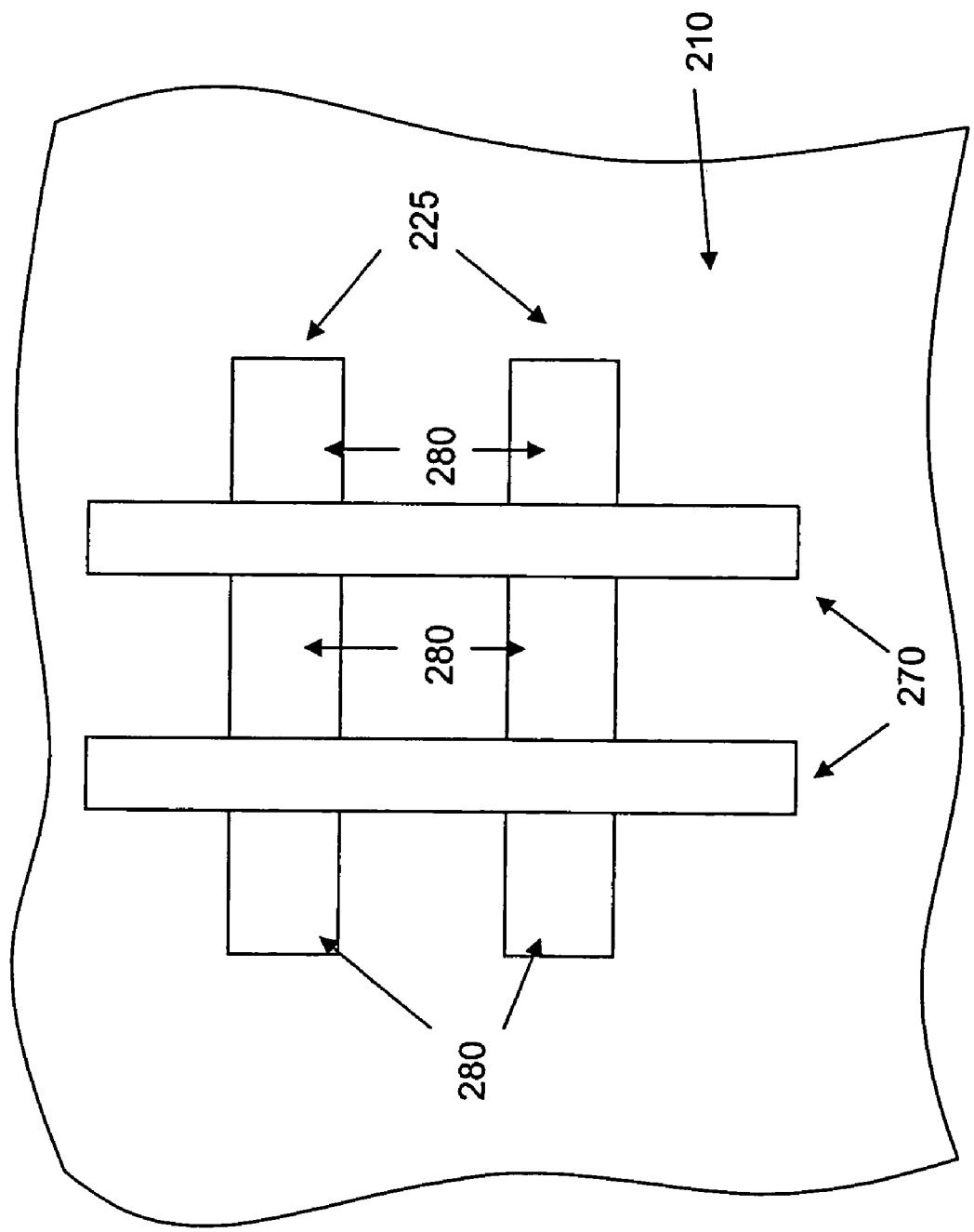
FIG. 2I is a schematic top view of an exemplary field effect transistor in accordance with the present invention.

FIG. 2I is a schematic top view of an exemplary field effect transistor showing source/drain (S/D) regions 280 formed within the conductive regions 225 and adjacent to the gate electrode layers 270. The S/D regions 280 can be formed by, for example, an implantation process. In some embodiments wherein a P-type S/D region is formed within the conductive region 225, a P-type dopant, such as boron or gallium, can be implanted into the conductive region 225. In other embodiments wherein a N-type S/D region is formed, a N-type dopant, such as phosphorous or arsenic is used.

As mentioned above, the processes of removing the first and second cap dielectric layer 230' and 240', respectively, can cause a thickness loss of the sacrificial dielectric layer 250'. Therefore, in order to prevent forming an undercut at the region within the isolation layer 210 beneath the conductive regions 225, the sacrificial dielectric layer 250 is formed to a thickness larger than the thickness loss caused by the removal processes of the cap dielectric layer or layers. In embodiments having a cap dielectric layer, the sacrificial dielectric layer 250 should be formed to a thickness at least larger than the thickness loss caused by the removal process of the cap dielectric layer. In one embodiment, the thickness of the sacrificial dielectric layer 250 is at least larger than a thickness loss caused by processes utilized to remove the cap dielectric layer(s) and to clean the substrate before forming the gate dielectric layer 260 thereon. In one embodiment, the sacrificial dielectric layer 250 is formed to a thickness from about 400 Å to about 1000 Å. One of ordinary skill in the art, however, will understand how to modify the thickness of the sacrificial dielectric layer 260 in response to the thickness loss resulting from subsequent removing or cleaning processes. The method provided herein has particular applicability in forming nanometer device size structures, such as FET structures have 90 nm, 65 nm or smaller feature sizes.

As shown in FIG. 2H, a field effect transistor formed on the substrate 200 having the isolation layer 210 formed thereon includes the conductive region 225, the gate dielectric layer 260, the gate 270 and S/D regions 280 (shown in FIG. 2I). The conductive region 225 is formed on the isolation layer 210 substantially without undercut at the region within the isolation layer 210 beneath the conductive region 225. The gate dielectric layer 260 and the gate 270 are formed on the conductive region 225, and S/D regions are formed within the conductive region and adjacent to the gate 270. In some embodiments, any undercut (not shown) within the isolation layer 210 and beneath the conductive region 225 has a lateral depth no more than about 100 Å. Such an undercut may result from pattern defining and cleaning processes performed prior to formation of the sacrificial dielectric layer 250, such as the process of patterning the conductive region 225 or a cleaning process for forming a lining oxide.

Although the present invention has been described in terms of exemplary embodiments, it is not limited thereto. Rather, the appended claims should be constructed broadly to include other variants and embodiments of the invention that may be made by those skilled in the field of this art without departing from the scope and range of equivalents of the invention.

What is claimed is:

1. A method for forming active regions of field effect transistors, comprising:
    (a) forming at least one conductive region over an isolation layer formed on a substrate, and a cap dielectric layer on the at least one conductive region;
    (b) forming a sacrificial dielectric layer over the isolation layer and the cap dielectric layer, and on sidewalls of the at least one conductive region;
    (c) removing a portion of the sacrificial dielectric layer on the cap dielectric layer;
    (d) removing the cap dielectric layer; and
    (e) removing remaining portions of the sacrificial dielectric layer.

2. The method of claim 1, wherein the cap dielectric layer includes a first cap dielectric layer and a second cap dielectric layer.

3. The method of claim 2, wherein step (d) comprises the step of removing the first cap dielectric layer and the second cap dielectric layer.

4. The method of claim 3, wherein the sacrificial dielectric layer is formed to a thickness at least larger than a thickness loss caused by removing the first cap dielectric layer and the second cap dielectric layer.

5. The method of claim 1, further comprising performing a sputtering step to trim the remaining portions of the sacrificial dielectric layer prior to removal thereof.

6. The method of claim 1, wherein the at least one conductive region has a mesa structure.

7. The method of claim 1, wherein the sacrificial dielectric layer is formed to a thickness at least larger than a thickness loss caused by step (d).

8. The method of claim 1, wherein step (c) is performed by a chemical mechanical polish (CMP) process with a high selectivity slurry.

9. The method of claim 8, wherein the CMP process with the high selectivity slurry has different removing rates for different regions of the sacrificial dielectric layer in response to different polish pressures applied thereto.

10. The method of claim 9, wherein the high selectivity slurry comprises a ceria-based abrasive and an electronegative surfactant.

11. The method of claim 1, further comprising the step of performing a cleaning process after step (d), wherein said sacrificial dielectric layer has a thickness during said cleaning process sufficient to substantially protect said at least one conductive region from undercut in the isolation layer.

12. An integrated circuit including a plurality field effect transistors having active regions formed by the process of claim 1.

13. A method for forming active regions of field effect transistors, comprising:
(a) forming at least one conductive mesa over an isolation layer formed on a substrate, and a cap dielectric layer on the at least one conductive mesa;
(b) forming a sacrificial dielectric layer over the isolation layer and the cap dielectric layer, and on sidewalls of the at least one conductive mesa;
(c) removing a portion of the sacrificial dielectric layer on the cap dielectric layer by a chemical mechanical polish (CMP) process with a high selectivity slurry;
(d) removing the cap dielectric layer, wherein the sacrificial dielectric layer is formed to a thickness at least larger than a thickness loss caused by removal step (d); and
(e) removing remaining portions of the sacrificial dielectric layer.

14. The method of claim 13, wherein the cap dielectric layer includes a first cap dielectric layer and a second cap dielectric layer.

15. The method of claim 14, wherein step (d) comprises the step of removing the first cap dielectric layer and the second dielectric layer.

16. The method of claim 15, wherein the sacrificial dielectric layer is formed to a thickness at least larger than a thickness loss caused by removing the first cap dielectric layer and the second cap dielectric layer.

17. The method of claim 13, further comprising performing a sputtering step to trim the remaining portions of the sacrificial dielectric layer prior to removal thereof.

18. The method of claim 13, wherein the CMP process with the high selectivity slurry has different removing rates for different regions of the sacrificial dielectric layer in response to different polish pressures applied thereto.

19. The method of claim 18, wherein the high selectivity slurry comprises a ceria-based abrasive and an electronegative surfactant.

20. A method for forming field effect transistors, comprising:
(a) forming at least one conductive mesa over an isolation layer formed on a substrate, and a cap dielectric layer on the at least one conductive mesa;
(b) forming a sacrificial dielectric layer over the isolation layer and the cap dielectric layer, and on sidewalls of the at least one conductive mesa;
(c) removing a portion of the sacrificial dielectric layer on the cap dielectric layer by a chemical mechanical polish (CMP) process with a high selectivity slurry;
(d) removing the cap dielectric layer;
(e) removing remaining portions of the sacrificial dielectric layer;
(f) forming a gate on the at least one conductive region; and
(g) forming source/drain (S/D) regions within the at least one conductive region and adjacent to the gate.

21. The method of claim 20, wherein the cap dielectric layer includes a first cap dielectric layer and a second cap dielectric layer.

22. The method of claim 21, wherein step (d) comprises the step of removing the first cap dielectric layer and the second dielectric layer.

23. The method of claim 22, wherein the sacrificial dielectric layer is formed to a thickness at least larger than a thickness loss caused by removing the first cap dielectric layer and the second cap dielectric layer.

24. The method of claim 20, further comprising performing a sputtering step to trim the remaining portions of the sacrificial dielectric layer prior to removal thereof.

25. The method of claim 20, wherein the at least one conductive region has a mesa structure.

26. The method of claim 20, wherein the sacrificial dielectric layer is formed to a thickness at least larger than a thickness loss caused by step (d).

27. The method of claim 20, wherein step (c) is performed by a chemical mechanical polish (CMP) process with a high selectivity slurry.

28. The method of claim 27, wherein the CMP process with the high selectivity slurry has different removing rates for different regions of the sacrificial dielectric layer in response to different polish pressures applied thereto.

29. The method of claim 28, wherein the high selectivity slurry comprises a ceria-based abrasive and an electronegative surfactant.

30. A method for forming field effect transistors, comprising:
(a) forming at least one conductive region over an isolation layer formed on a substrate;
(b) forming a sacrificial dielectric layer over the isolation layer and adjacent to said at least one conductive region;
(c) forming a gate dielectric layer over said at least one conductive region; and
(d) performing a cleaning process prior to forming said gate dielectric layer, wherein said sacrificial dielectric layer is formed to a thickness sufficient to substantially protect said at least one conductive region from undercut in the isolation layer from said cleaning process; and
(e) after said cleaning process, and before said gate dielectric forming step, removing remaining portions of the sacrificial dielectric layer.

31. The method of claim 30, wherein said cleaning process utilizes a HF solution.

* * * * *